United States Patent
Ryu

(10) Patent No.: US 11,309,413 B2
(45) Date of Patent: Apr. 19, 2022

(54) SEMICONDUCTOR DEVICE WITH IMPROVED SHORT CIRCUIT WITHSTAND TIME AND METHODS FOR MANUFACTURING THE SAME

(71) Applicant: Wolfspeed, Inc., Durham, NC (US)

(72) Inventor: Sei-Hyung Ryu, Cary, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 16/598,646

(22) Filed: Oct. 10, 2019

(65) Prior Publication Data

US 2021/0111279 A1    Apr. 15, 2021

(51) Int. Cl.
*H01L 29/78*    (2006.01)
*H01L 29/10*    (2006.01)
(Continued)

(52) U.S. Cl.
CPC ........ *H01L 29/7802* (2013.01); *H01L 21/266* (2013.01); *H01L 21/823493* (2013.01); *H01L 29/0869* (2013.01); *H01L 29/1095* (2013.01); *H01L 29/36* (2013.01); *H01L 29/66068* (2013.01); *H01L 29/66333* (2013.01); *H01L 29/66712* (2013.01); *H01L 29/7395* (2013.01)

(58) Field of Classification Search
CPC ................ H01L 29/36; H01L 29/7802; H01L 29/66333; H01L 29/7395; H01L 21/823493; H01L 29/1095; H01L 29/66712; H01L 29/0869; H01L 2924/13055; H01L 21/266; H01L 29/78; H01L 21/1095
See application file for complete search history.

(56) References Cited

U.S. PATENT DOCUMENTS

| | | |
|---|---|---|
| 5,729,037 A | 3/1998 | Hshieh et al. |
| 6,048,759 A | 4/2000 | Hshieh et al. |

(Continued)

FOREIGN PATENT DOCUMENTS

EP    1132970 A2    9/2001

OTHER PUBLICATIONS

Shenoy, P.M. et al., "The Influence of Body Effect on the Short-circuit Ruggedness of Emitter Ballasted IGBTs," Proceedings of 2001 International Symposium on Power Semiconductor Devices & Ics (IPSD '01), Jun. 4-7, 2001, Osaka, Japan, pp. 311-314.

(Continued)

*Primary Examiner* — Jose R Diaz
(74) *Attorney, Agent, or Firm* — Withrow & Terranova, P.L.L.C.

(57) ABSTRACT

A semiconductor device includes a substrate, a drift layer, a well region, and a source region. The substrate has a first conductivity type. The drift layer has the first conductivity type and is on the substrate. The well region has a second conductivity type opposite the first conductivity type and provides a channel region. The source region is in the well region and has the first conductivity type. A doping concentration of the well region along a surface of the drift layer opposite the substrate is variable such that the well region includes a region of increased doping concentration at a distance from a junction between the source region and the well region.

27 Claims, 14 Drawing Sheets

(51) Int. Cl.
*H01L 29/66* (2006.01)
*H01L 29/08* (2006.01)
*H01L 21/266* (2006.01)
*H01L 21/8234* (2006.01)
*H01L 29/36* (2006.01)
*H01L 29/739* (2006.01)

(56) References Cited

U.S. PATENT DOCUMENTS

| | | | |
|---|---|---|---|
| 6,071,781 A * | 6/2000 | Nakajima | H01L 21/2652 438/291 |
| 6,501,128 B1 * | 12/2002 | Otsuki | H01L 29/1095 257/330 |
| 2009/0218620 A1 * | 9/2009 | Hebert | H01L 29/41775 257/336 |
| 2010/0200931 A1 * | 8/2010 | Matocha | H01L 29/66068 257/401 |
| 2014/0110797 A1 * | 4/2014 | Tatemichi | H01L 29/7802 257/409 |
| 2014/0284656 A1 * | 9/2014 | Inoue | H01L 29/0657 257/139 |
| 2016/0163817 A1 | 6/2016 | Horii et al. | |

OTHER PUBLICATIONS

International Search Report and Written Opinion for International Patent Application No. PCT/US2020/054115, dated Jan. 20, 2021, 17 pages.

\* cited by examiner

SEMICONDUCTOR DEVICE WITH IMPROVED SHORT CIRCUIT WITHSTAND TIME AND METHODS FOR MANUFACTURING THE SAME

FIELD OF THE DISCLOSURE

The present disclosure is related to semiconductor devices and, in particular, to improvements to semiconductor devices to increase the short circuit withstand time thereof.

BACKGROUND

Metal-oxide-semiconductor field-effect transistors (MOSFETs) are widely used in power electronics. One important performance characteristic of MOSFETs used for power applications is short circuit withstand time. The short circuit withstand time of a MOSFET is the amount of time the MOSFET is able to withstand a short circuit event (e.g., drain-to-source short) before failure occurs. The longer the short circuit withstand time of a MOSFET, the less likely it will fail in an application due to a short circuit event. Accordingly, it is desirable to have a large short circuit withstand time.

Recently, silicon carbide MOSFETs have been replacing their silicon counterparts for power applications. This is due to the significant improvements in performance such as on-state resistance and switching speed of silicon carbide MOSFETs. However, the short circuit withstand time of silicon carbide MOSFETs has conventionally been limited due to MOS channel properties and short channel effects. With respect to MOS channel properties, the threshold voltage of silicon carbide MOSFETs decreases with temperature, while transconductance increases with temperature. These properties degrade the short circuit withstand time of silicon carbide MOSFETs. With respect to short channel effects, these result in poor saturation characteristics with relatively low output resistance. These effects further degrade the short circuit withstand time of silicon carbide MOSFETs.

Conventionally, efforts to increase the short circuit withstand time of silicon carbide MOSFETs have involved increasing a resistance in a junction field-effect transistor (JFET) region of the device and/or adding external resistors to a source of the device. While these solutions do in fact increase the short circuit withstand time of a silicon carbide MOSFET, they also increase the on-state resistance thereof, which degrades overall performance.

Accordingly, there is a need for MOSFETs with improved short circuit withstand times that do not compromise on other performance characteristics and methods for manufacturing the same.

SUMMARY

In one embodiment, a semiconductor device includes a substrate, a drift layer, a well region, and a source region. The substrate has a first conductivity type. The drift layer has the first conductivity type and is on the substrate. The well region has a second conductivity type opposite the first conductivity type and provides a channel region. The source region is in the well region and has the first conductivity type. The well region is between the source region and the drift layer. A doping concentration of the well region along a surface of the drift layer opposite the substrate is non-uniform such that the doping concentration of the well region varies in a lateral dimension. By providing the well region with the doping profile as described, a short circuit withstand time of the semiconductor device may be improved while maintaining other performance characteristics of the device.

In one embodiment, the well region includes a region of increased carrier concentration at a distance from an interface between the source region and the well region. The region of increased carrier concentration may overlap with the channel region.

In one embodiment, a semiconductor device includes a substrate, a drift layer, a well region, and a source region. The substrate has a first conductivity type. The drift layer has the first conductivity type and is on the substrate. The well region has a second conductivity type opposite the first conductivity type and provides a channel region. The source region is in the well region and has the first conductivity type. The well region is between the source region and the drift layer. A depth of the source region is non-uniform. By providing the source region with a variable depth as described, a short circuit withstand time of the semiconductor device may be improved while maintaining other performance characteristics of the device.

In one embodiment, the depth of the source region increases in proportion to a distance from the channel region.

In one embodiment, a method for manufacturing a semiconductor device includes providing a substrate, providing a drift layer on the substrate, providing a well region in the drift layer, and providing a source region in the well region. The substrate and the drift layer have the first conductivity type. The well region has a second conductivity type opposite the first conductivity type and provides a channel region. The source region has the first conductivity type, and is provided such that the well region is between the source region and the drift layer. A doping concentration of the well region along a surface of the drift layer opposite the substrate is non-uniform such that the doping concentration of the well region varies in a lateral dimension. By providing the well region with a variable doping concentration as discussed above, a short circuit withstand time of the semiconductor device may be improved while maintaining other performance characteristics of the device.

In various embodiments, the semiconductor device is a metal-oxide-semiconductor field-effect transistor (MOSFET).

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
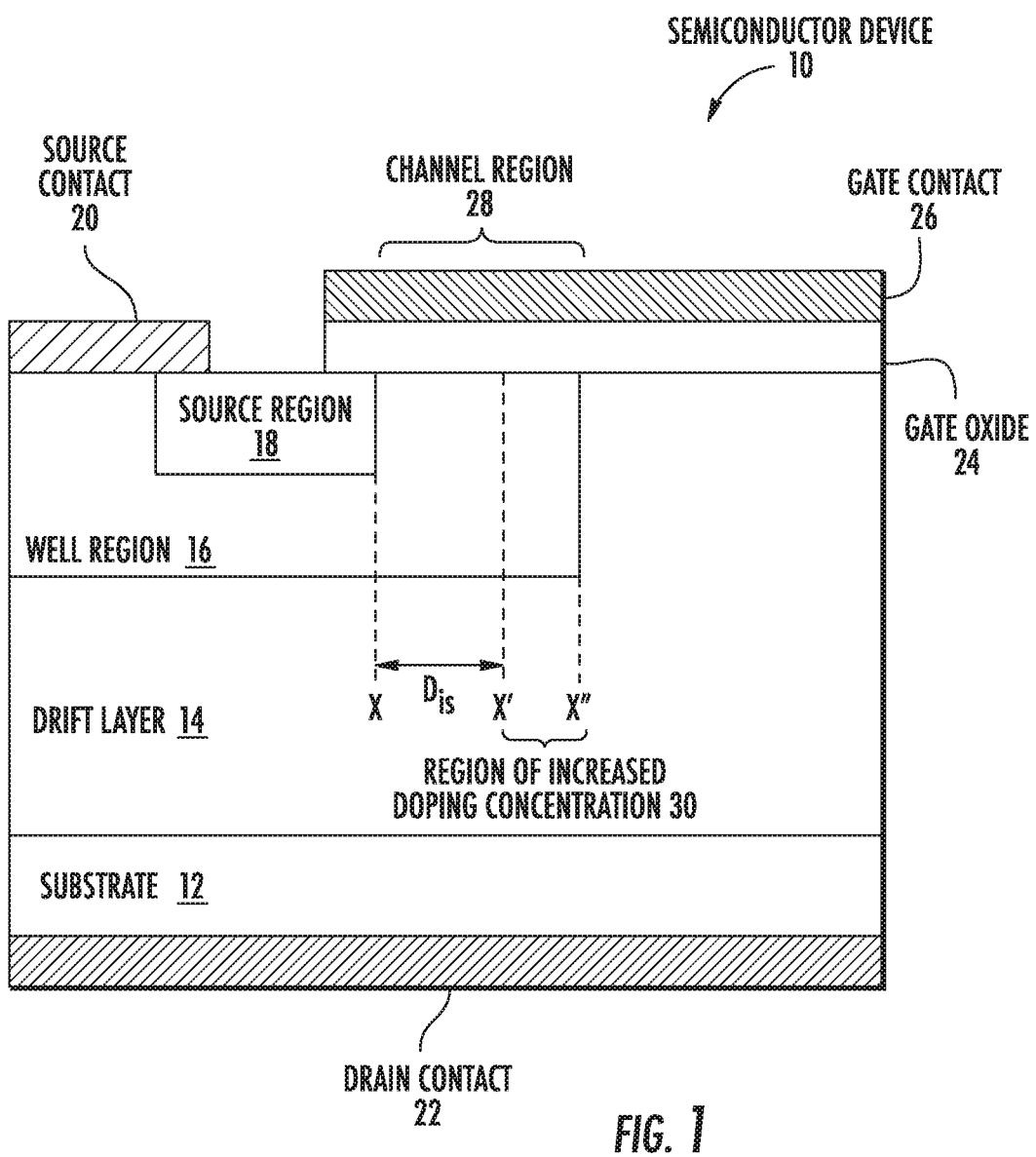
FIG. 1 illustrates a semiconductor device according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a semiconductor device 10 according to one embodiment of the present disclosure. The semiconductor device 10 includes a substrate 12, a drift layer 14 on the substrate 12, a well region 16 in a surface of the drift layer 14 opposite the substrate 12, a source region 18 in the surface of the drift layer 14 opposite the substrate 12 such that the source region 18 is within the well region 16, a source contact 20 on the surface of the drift layer 14 opposite the substrate 12, and in particular on a portion of the well region 16 and the source region 18, a drain contact 22 on a surface of the substrate 12 opposite the drift layer 14, a gate oxide 24 on the surface of the drift layer 14 opposite the substrate 12, and in particular on a portion of the well region 16 and the source region 18, and a gate contact 26 on the gate oxide 24. The source contact 20 is separated from the gate oxide 24 and the gate contact 26 on the surface of the drift layer 14 opposite the substrate 12. A portion of the well region 16 along the surface of the drift layer 14 opposite the substrate 12 below the gate oxide 24 forms a channel region 28 of the semiconductor device 10.

The substrate 12 and the drift layer 14 may comprise silicon carbide. In one embodiment, the substrate 12, the drift layer 14, and the source region 18 are all n-doped, and the well region 16 is p-doped. However, the principles of the present disclosure apply equally to a semiconductor device 10 wherein the substrate 12, the drift layer 14, and the source region 18 are p-doped and the well region is n-doped. The substrate 12 may have a doping concentration between $5 \times 10^{17}$ and $1 \times 10^{20}$ cm$^{-3}$. In various embodiments, the doping concentration of the substrate 12 may be any doping concentration in the range between $5 \times 10^{17}$ and $1 \times 10^{20}$ cm$^{-3}$, or may cover any sub-range in this range. The drift layer 14 may have a doping concentration between $5 \times 10^{13}$ and $1 \times 10^{18}$ cm$^{-3}$. In various embodiments, the doping concentration of the drift layer 14 may be any doping concentration in the range between $5 \times 10^{13}$ and $1 \times 10^{18}$ cm$^{-3}$, or may cover any sub-range in this range. As discussed in detail below, the well region 16 may include a region of increased doping concentration 30, which has a doping concentration between $2 \times 10^{17}$ and $5 \times 10^{19}$ cm$^{-3}$. The doping concentration of the region of increased doping concentration 30 may be any doping concentration in the range between $2 \times 10^{17}$ and $5 \times 10^{18}$ cm$^{-3}$, or may cover any sub-range in this range. For example, the doping concentration of the region of increased doping concentration 30 may be between $5 \times 10^{17}$ and $5 \times 10^{18}$ cm$^{-3}$, between $1 \times 10^{18}$ and $5 \times 10^{18}$ cm$^{-3}$, between $5 \times 10^{18}$ and $5 \times 10^{18}$ cm$^{-3}$, between $1 \times 10^{18}$ and $5 \times 10^{18}$ cm$^{-3}$, between $5 \times 10^{17}$ and $1 \times 10^{18}$ cm$^{-3}$, between $1 \times 10^{18}$ and $1 \times 10^{18}$ cm$^{-3}$, and the like. A remainder of the well region 16 may have a doping concentration between $5 \times 10^{18}$ and $5 \times 10^{17}$ cm$^{-3}$. The doping concentration of the remainder of the well region 16 may be any doping concentration in the range between $5 \times 10^{18}$ and $5 \times 10^{17}$ cm$^{-3}$, or may cover any sub-range in this range. For example, the doping concentration of the remainder of the well region 16 may be between $1 \times 10^{18}$ and $5 \times 10^{17}$ cm$^{-3}$, between $5 \times 10^{18}$ and $5 \times 10^{17}$ cm$^{-3}$, between $1 \times 10^{17}$ and $5 \times 10^{17}$ cm$^{-3}$, between $5 \times 10^{18}$ and $1 \times 10^{17}$ cm$^{-3}$, between $5 \times 10^{18}$ and $5 \times 10^{16}$ cm$^{-3}$, and the like. The source region 18 may have a doping concentration between $1 \times 10^{18}$ and $5 \times 10^{21}$ cm$^{-3}$. The doping concentration of the source region 18 may be any doping concentration in the range between $1 \times 10^{18}$ and $5 \times 10^{21}$ cm$^{-3}$, or may cover any sub-range in this range. For example, the doping concentration of the source region 18 may be between $5 \times 10^{18}$ and $5 \times 10^{21}$ cm$^{-3}$, between $1 \times 10^{19}$ and $5 \times 10^{21}$ cm$^{-3}$, between $5 \times 10^{19}$ and $5 \times 10^{21}$ cm$^{-3}$, between $1 \times 10^{29}$ and $5 \times 10^{21}$ cm$^{-3}$, between $5 \times 10^{29}$ and $5 \times 10^{21}$ cm$^{-3}$, between $1 \times 10^{21}$ and $5 \times 10^{21}$ cm$^{-3}$, between $1 \times 10^{18}$ and $1 \times 10^{21}$ cm$^{-3}$, between $1 \times 10^{18}$ and $5 \times 10^{29}$ cm$^{-3}$, between $1 \times 10^{18}$ and $1 \times 10^{20}$ cm$^{-3}$, between $1 \times 10^{18}$ and $5 \times 10^{19}$ cm$^{-3}$, between $1 \times 10^{18}$ and $1 \times 10^{19}$ cm$^{-3}$, and the like.

In one embodiment, the semiconductor device 10 may be a metal-oxide-semiconductor field-effect transistor (MOSFET). In operation, a bias voltage provided at the gate contact 26 above a threshold voltage of the semiconductor device 10 causes the channel region 28 of the device to become conductive such that current can flow from the drain contact 22 to the source contact 20 thereof. When the bias voltage is below the threshold voltage of the semiconductor device 10, the channel region 28 is not sufficiently conductive to allow current to flow from the drain contact 22 to the source contact 20. Accordingly, the semiconductor device 10 blocks the drain-to-source voltage across the drift layer 14. As discussed above, in some applications, the semiconductor device 10 may experience a short circuit event such that the drain contact 22 is shorted to a power supply. These short circuit events can cause extremely high currents to flow through the semiconductor device 10 and cause damage and failure to the device after a short period of time. As discussed above, the amount of time a device can withstand a short circuit event without failure is referred to as a short circuit withstand time. Further as discussed above, conventional MOSFETs, and especially silicon carbide MOSFETs, have suffered from relatively low short circuit withstand times.

As discussed above, one reason for the relatively low short circuit withstand times of silicon carbide MOSFETs is due to MOS channel properties wherein transconductance increases and threshold voltage decreases with increasing temperature. When the semiconductor device 10 is on, current flows from the drift layer 14, along an inversion layer in the well region 16, into the source region 18, and to the source contact 20. This current flow results in a voltage drop across the source region 18 due to a finite resistance of the source region 18. This voltage drop across the source region 18 resistance ($V_{sp}$) is positive, and thus adds to the reverse bias between the source region 18 and the well region 16. A threshold voltage ($V_{th}$) of the semiconductor device 10 can be expressed according to Equation (1):

$$V_{th} = V_{th0} + \gamma(\sqrt{2\phi_p + V_{sp}} - \sqrt{2\phi_p}) \qquad (1)$$

where $V_{th}$ is the threshold voltage of the semiconductor device 10, $V_{th0}$ is the threshold voltage of the semiconductor device 10 when $V_{sp}$ (the voltage across the source region 18 resistance) is zero, $\gamma$ is the body effect parameter given by Equation (2):

$$\gamma = \frac{\sqrt{2\varepsilon_{SiC} q N_A}}{C_{ox}} \qquad (2)$$

and $\phi_p$ is given by Equation (3):

$$\phi_p = \frac{kT}{q} \ln\left(\frac{N_A}{n_i}\right) \qquad (3)$$

where $N_A$ is the doping concentration of the well region 16. As shown in the equations above, $V_{th}$ increases as $V_{sp}$ increases. Further, $V_{th}$ increases faster with heavier doping concentration of the well region 16, $N_A$. Accordingly, one way to counter or offset the increase in transconductance and decrease in threshold voltage with respect to temperature of the semiconductor device 10 is by increasing a doping concentration of the well region 16. However, increasing the doping concentration of the entirety of the well region 16 results in an unacceptably high threshold voltage during normal operating conditions and low channel mobility (or low transconductance). While the channel region 28 of the semiconductor device 10 could be shortened to have a length less than 0.2 micrometers (μm) to lower the threshold voltage and increase transconductance, manufacturing MOSFETs with these small dimensions can be very difficult.

Accordingly, in an effort to increase the short circuit withstand time of the semiconductor device 10, the well region 16 has a non-uniform doping profile that varies in a lateral dimension. Specifically, the well region 16 includes the region of increased doping concentration 30. The region of increased doping concentration 30 is a sub-region of the well region 16 that is doped higher than the remainder of the well region 16. The region of increased doping concentration 30 is located within the well region 16 along a surface of the drift layer 14 opposite the substrate 12, and thus is in the channel region 28. The region of increased doping concentration 30 is located some distance $D_{is}$ from a junction between the source region 18 and the well region 16 along the surface of the drift layer 14 opposite the substrate 12 such that the region of increased doping concentration 30 is separated from the source region 18 by the distance as discussed below. By including the region of increased doping concentration 30 and keeping the remainder of the well region 16 doped to a lesser level, a favorable tradeoff between short circuit withstand time, threshold voltage, and transconductance is made. Specifically, the short circuit withstand time is significantly increased with minimal impact on the threshold voltage and transconductance of the semiconductor device 10. Further, the area of increased doping concentration 30 may also reduce short channel effects by suppressing the lateral depletion of the well region 16 and thus increasing shielding of the channel region 28 from high electric fields. While the region of increased doping concentration 30 is shown as a discrete region within the well region 16, the delineation between the region of increased doping concentration 30 and the remainder of the well region 16 may be gradual. In general, a doping concentration of the well region 16 may increase in proportion to a distance from an interface between the source region 18 and the well region 16 along the surface of the drift region 14 opposite the substrate 12 (point X) towards an interface between the well region 16 and the drift region 14 along the surface of the drift region 14 opposite the substrate 12 (point X"). The highest doping concentration of the well region 16 may thus occur at the interface between the well region 16 and the drift region 14 along the surface of the drift region 14 opposite the substrate 12 (point X"), while the lowest doping concentration of the well region 16 may occur at the interface between the source region 18 and the well region 14 along the surface of the drift region opposite the substrate 12 (point X).

Figure 2A:
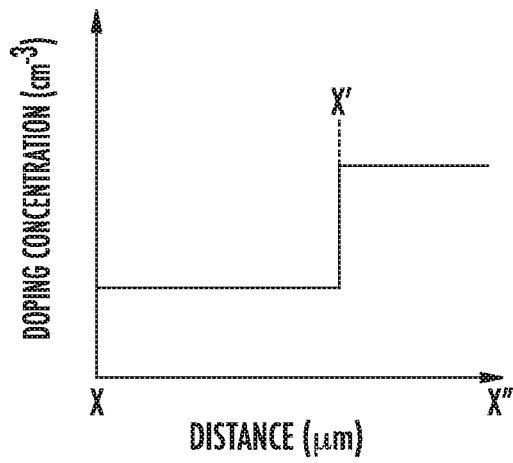
FIGS. 2A through 2D illustrate doping profiles of a well region in a MOSFET according to one embodiment of the present disclosure.

FIG. 2A illustrates a doping profile of the well region 16 along the surface of the drift layer 14 opposite the substrate 12 between points X and X" illustrated in FIG. 1 according to one embodiment of the present disclosure, where point X is on an edge of the source region 18 (interface between the source region 18 and the well region 16) that extends perpendicular to a surface of the drift layer 14 opposite the substrate 12 and point X" is on an edge of the well region 16 (interface between the well region 16 and the drift layer 14) that extends perpendicular to the surface of the drift layer 14 opposite the substrate 12. As shown, the doping concentration of the well region 16 along the surface of the drift layer 14 opposite the substrate 12 remains relatively constant between points X and X', at which time it increases and remains at this level until point X", which is the interface between the side of the well region 16 and the drift layer 14. The region of increased doping concentration 30 is between points X' and X".

In one embodiment, the region of increased doping concentration 30 has a doping concentration that is between 1.1 and 250 times greater than a doping concentration of the remainder of the well region 16. The doping concentration of the region of increased doping concentration 30 may be greater than the doping concentration of the remainder of the well region 16 by any factor in the range between 1.1 and 250, or any sub-range of this range. For example, in various embodiments, the doping concentration of the region of increased doping concentration 30 is between 10 and 250 times greater, between 50 and 250 times greater, between 100 and 250 times greater, and between 200 and 250 times greater than the doping concentration of the remainder of the well region 16. In particular and as discussed above, the region of increased doping concentration 30 may have a doping concentration between $2 \times 10^{17}$ and $5 \times 10^{19}$ cm$^{-3}$, while the remainder of the well region 16 may have a doping concentration between $5 \times 10^{15}$ and $5 \times 10^{17}$ cm$^{-3}$. The distance $D_{is}$ between point X and X', which is the distance between the source region 18 and the region of increased doping concentration 30 along the surface of the drift layer 14 opposite the substrate 12, may be between 0.2 and 2 μm, or any sub-range of this range. For example, in various embodiments the distance $D_{is}$ between point X and X' may be between 0.3 and 2 μm, between 0.4 and 2 μm, between 0.5 and 2 μm, between 0.6 and 2 μm, between 0.7 and 2 μm, between 0.8 and 2 μm, between 0.9 and 2 μm, between 1 and 2 μm, between 1.1 and 2 μm, between 1.2 and 2 μm, between 1.3 and 2 μm, between 1.4 and 2 μm, between 1.5 and 2 μm, between 1.6 and 2 μm, between 1.7 and 2 μm, between 1.8 and 2 μm, between 1.9 and 2 μm, between 0.5 and 1 μm, between 0.5 and 1.5 μm, between 1 and 1.5 μm, or any other sub-range between 0.2 and 2 μm. A width of the region of increased doping concentration 30, which is the distance between point X' and X", may be between 0.05 and 0.5 μm, including any sub-range of this range. For example, in various embodiments a width of the region of increased doping concentration 30 may be between 0.1 and 0.5 μm, between 0.15 and 0.5 μm, between 0.2 and 0.5 μm, between 0.25 and 0.5 μm, between 0.3 and 0.5 μm, between 0.35 and 0.5 μm, between 0.4 and 0.5 μm, between 0.45 and 0.5 μm, between 0.1 and 0.2 μm, between 0.1 and 0.3 μm, between 0.1 and 0.4 μm, or any other sub-range between 0.05 and 0.5 μm.

Figure 2B:
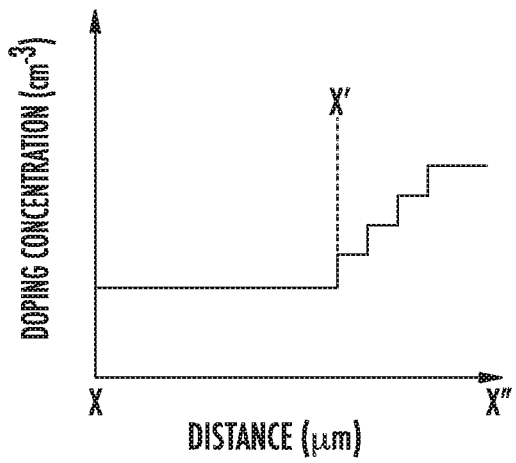

FIG. 2B illustrates a doping profile of the well region 16 along the surface of the drift layer 14 opposite the substrate 12 between points X and X" according to an additional embodiment of the present disclosure. As shown, the doping concentration of the well region 16 along the surface of the drift layer 14 opposite the substrate 12 remains relatively constant until point X', at which time it increases in a stepwise fashion, reaching a higher level at which it remains until point X".

Figure 2C:
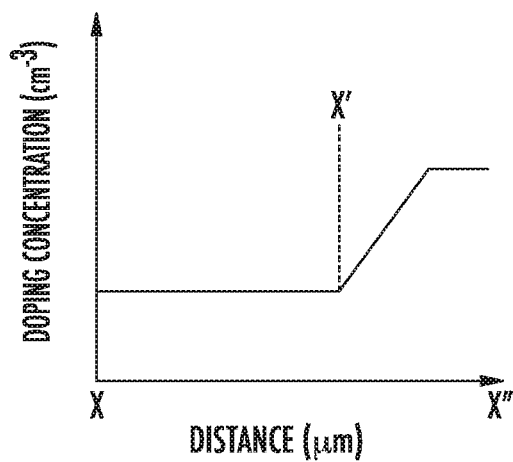

FIG. 2C illustrates a doping profile of the well region 16 along the surface of the drift layer 14 opposite the substrate 12 between points X and X" according to an additional embodiment of the present disclosure. As shown, the doping concentration of the well region 16 along the surface of the drift layer 14 opposite the substrate 12 remains relatively constant until point X', at which time it increases in a linear fashion, reaching a higher level at which it remains until point X".

Figure 2D:
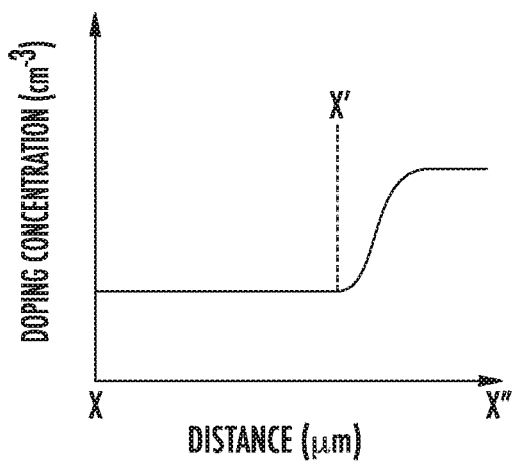

FIG. 2D illustrates a doping profile of the well region 16 along the surface of the drift layer 14 opposite the substrate 12 between points X and X" according to an additional embodiment of the present disclosure. As shown, the doping concentration of the well region 16 along the surface of the drift layer 14 opposite the substrate 12 remains relatively constant until point X', at which time it increases in an exponential fashion, reaching a higher level at which it remains until point X". Notably, the foregoing FIGS. 2A through 2D are merely exemplary, and the doping profile of the well region 16 along the surface of the drift layer 14 opposite the substrate 12 may vary in any suitable fashion without departing from the principles of the present disclosure. In general, the doping concentration of the well region 16 is non-uniform such that the doping concentration varies in a lateral dimension. The doping concentration of the well region 16 may be constant in a first sub-region (e.g., between X and X') and variable in a second sub-region (e.g., between X' and X"), or the doping concentration of the well region 16 may be variable across an entirety of the well region 16 (e.g., between X and X"). The doping concentration of the well region 16 may vary in any suitable manner (linear, gradient, stepwise, exponentially, etc.)

To further improve the short circuit withstand time of the semiconductor device 10, the resistance of the source region 18 can be increased. As discussed above, this has conventionally been done by adding an external resistor to the source region 18. However, adding an external resistor to the source region 18 will have an unfavorable impact on other performance characteristics of the semiconductor device 10. Another way to increase the resistance of the source region 18 is to reduce a doping concentration of the source region 18. However, uniformly reducing a doping concentration of the source region 18 may result in non-linear ohmic contacts to the source contact 20, which can add a significant amount of forward voltage drop to the semiconductor device 10.

Figure 3:
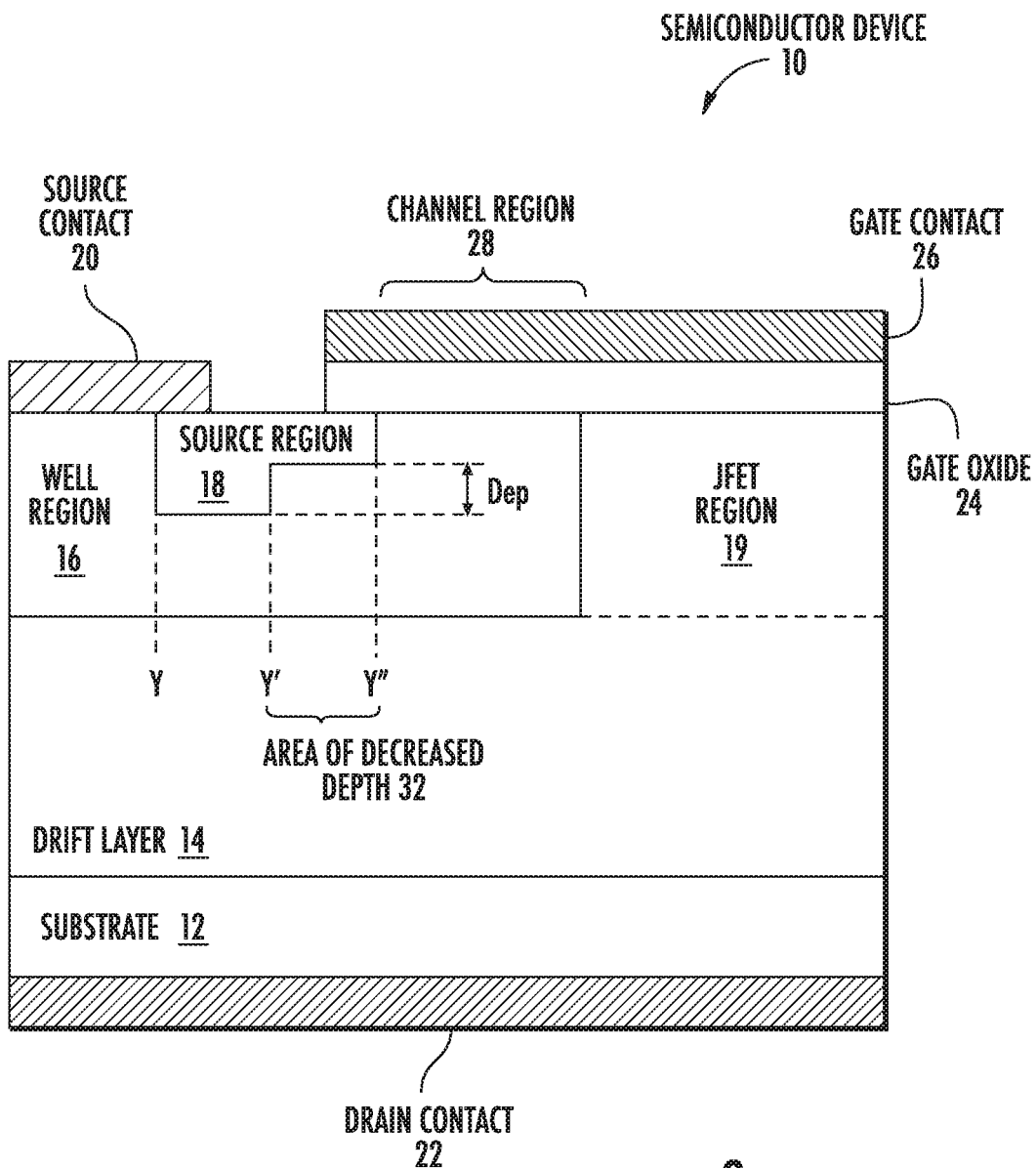
FIG. 3 illustrates a semiconductor device according to one embodiment of the present disclosure.

Accordingly, FIG. 3 shows the semiconductor device 10 according to an additional embodiment of the present disclosure. The semiconductor device 10 shown in FIG. 3 is substantially similar to that shown in FIG. 1, except that a depth of the source region 18 is non-uniform such that the depth of the source region 18 varies in a lateral dimension. In particular, the source region 18 includes an area of decreased depth 32, which has a depth that is less than a depth of the remainder of the source region 18. The area of decreased depth 32 is located on an edge of the source region 18 adjacent to the channel region 28 of the semiconductor device 10 (interface between the source region 18 and the well region 16) where the edge is perpendicular to the surface of the drift layer 14 opposite the substrate 12. As shown, the source region 18 may be provided laterally between point Y and Y″, where point Y″ is located on a first edge of the source region 18 that extends perpendicular to the surface of the drift layer 14 opposite the substrate 12 adjacent to the channel region 28 and point Y is located a second edge of the source region 18 that extends parallel to the first edge. At a point Y′ the depth of the source region 18 may decrease, thereby starting the area of decreased depth 32. In one embodiment, a width of the source region 18 between points Y and Y′ is between 0.1 and 5 µm or any sub-range of this range. For example, in various embodiments the width of the source region 18 between points Y and Y′ may be between 0.2 and 5 µm, between 0.3 and 5 µm, between 0.4 and 5 µm, between 0.5 and 5 µm, between 1 and 5 µm, between 1.5 and 5 µm, between 2 and 5 µm, between 2.5 and 5 µm, between 3 and 5 µm, between 3.5 and 5 µm, between 4 and 5 µm, between 4.5 and 5 µm, between 0.1 and 1 µm, between 1 and 2 µm, between 0.1 and 3 µm, between 1 and 3 µm, between 1 and 4 µm, between 2 and 4 µm, between 3 and 5 µm, and the like. A width of the area of decreased depth 32, which is the distance between points Y′ and Y″, is also between 0.1 and 5 µm or any sub-range of this range. For example, the width of the area of decreased depth 32 may be between 0.2 and 5 µm, between 0.3 and 5 µm, between 0.4 and 5 µm, between 0.5 and 5 µm, between 1 and 5 µm, between 1.5 and 5 µm, between 2 and 5 µm, between 2.5 and 5 µm, between 3 and 5 µm, between 3.5 and 5 µm, between 4 and 5 µm, between 4.5 and 5 µm, between 0.1 and 1 µm, between 1 and 2 µm, between 0.1 and 3 µm, between 1 and 3 µm, between 1 and 4 µm, between 2 and 4 µm, between 3 and 5 µm, and the like. A depth of the source region 18 within the area of decreased depth 32 $D_{ep}$ may be between 0.1 and 1.0 µm or any sub-range of this range, while a depth of the source region 18 in the remainder thereof may be between 0.2 and 1.5 µm or any sub-range of this range. For example, the depth of the source region 18 within the area of decreased depth 32 $D_{ep}$ may be between 0.2 and 1.0 µm, between 0.3 and 1.0 µm, between 0.4 and 1.0 µm, between 0.5 and 1.0 µm, between 0.6 and 1.0 µm, between 0.7 and 1.0 µm, between 0.8 and 1.0 µm, between 0.9 and 1.0 µm, between 0.1 and 0.2 µm, between 0.1 and 0.3 µm, between 0.1 and 0.4 µm, between 0.1 and 0.5 µm, between 0.1 and 0.6 µm, between 0.1 and 0.7 µm, between 0.1 and 0.8 µm, between 0.1 and 0.9 µm, between 0.2 and 0.5 µm, between 0.3 and 0.6 µm, between 0.5 and 0.8 µm, and the like. The depth of the source region 18 in the remainder thereof may be between 0.3 and 1.5 µm, between 0.4 and 1.5 µm, between 0.5 and 1.5 µm, between 0.6 and 1.5 µm, between 0.7 and 1.5 µm, between 0.8 and 1.5 µm, between 0.9 and 1.5 µm, between 1.0 and 1.5 µm, between 1.1 and 1.5 µm, between 1.2 and 1.5 µm, between 1.3 and 1.5 µm, between 1.4 and 1.5 µm, between 0.5 and 1.0 µm, between 0.1 and 1.0 µm, between 0.1 and 0.5 µm, and the like. The depth of the area of decreased depth 32 may be between 0.06 and 0.93 times less than the depth of the remainder of the source region 18. While the area of decreased depth 32 is shown as a single step down in depth compared to the remainder of the source region 18, the area of decreased depth 32 may also be formed such that the depth of the source region 18 ramps down as the source region 18 approaches the channel region 28, or decreases in any suitable manner. In general, a depth of the source region 18 may be non-uniform such that the depth of the source region 18 increases in proportion to a distance of a lateral edge of the source region 18 nearest the channel region, where the lateral edge is perpendicular to the surface of the drift layer 14 opposite the substrate 12.

Figure 4:
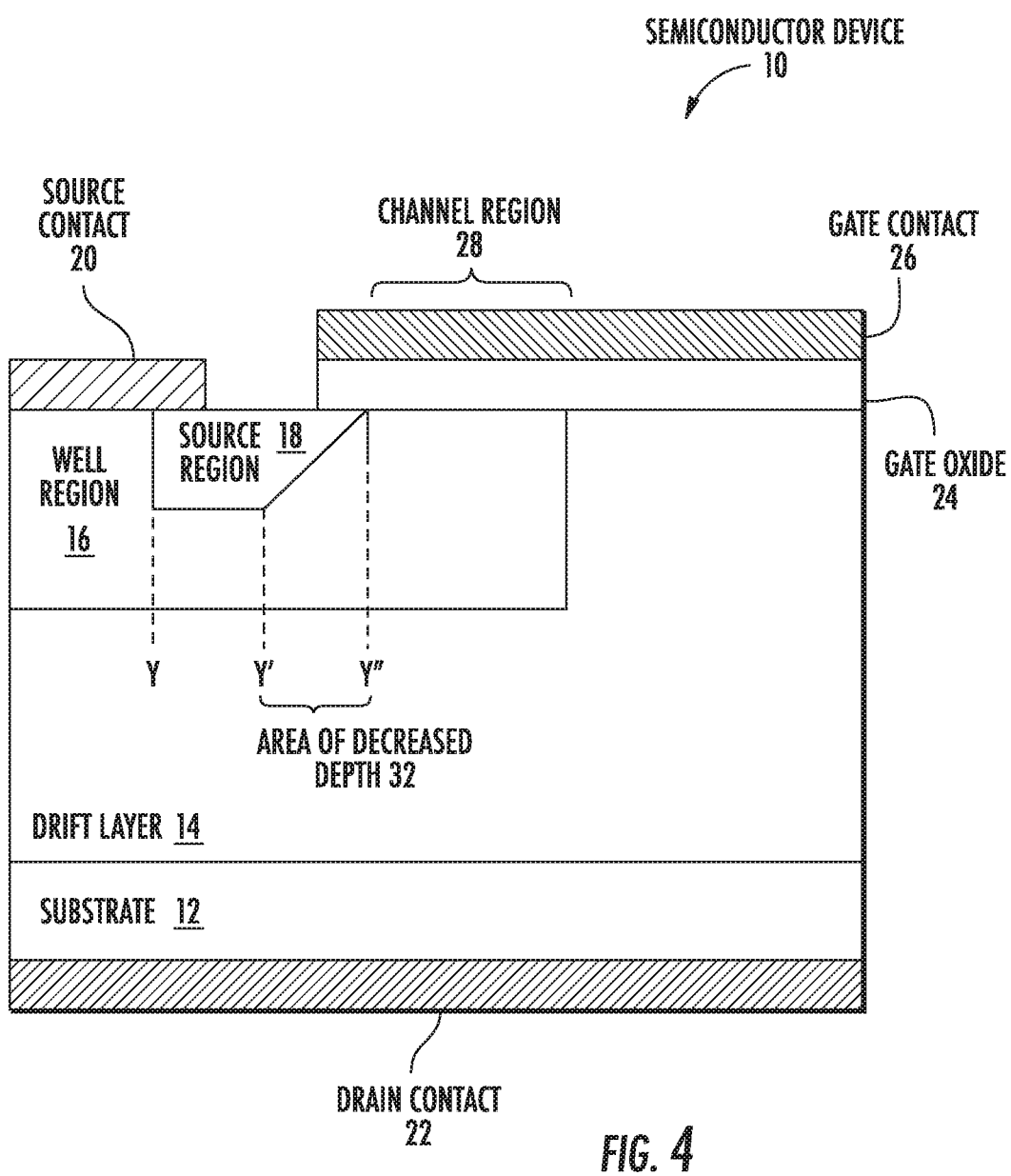
FIG. 4 illustrates a semiconductor device according to one embodiment of the present disclosure.

FIG. 4 shows another embodiment of the semiconductor device 10 wherein the depth of the source region 18 tapers off as it approaches the channel region 28. The area of decreased depth 32 may increase the resistance of the source region 18 while also maintaining linear ohmic contacts with the source contact 20. Accordingly, the short circuit withstand time of the semiconductor device 10 is improved without increasing a forward voltage drop thereof. Notably, the embodiments shown in FIG. 3 and FIG. 4 are merely exemplary. In general, the depth of the source region 18 may vary in any suitable fashion. For example, the depth of the source region 18 may vary across an entirety of the source region 18 in the lateral dimension (e.g., between Y and Y″, or any sub-region thereof (e.g., between Y′ and Y″). The depth of the source region 18 may vary in any suitable manner (e.g., linear, gradient, stepwise, exponentially, etc.)

Figure 5:
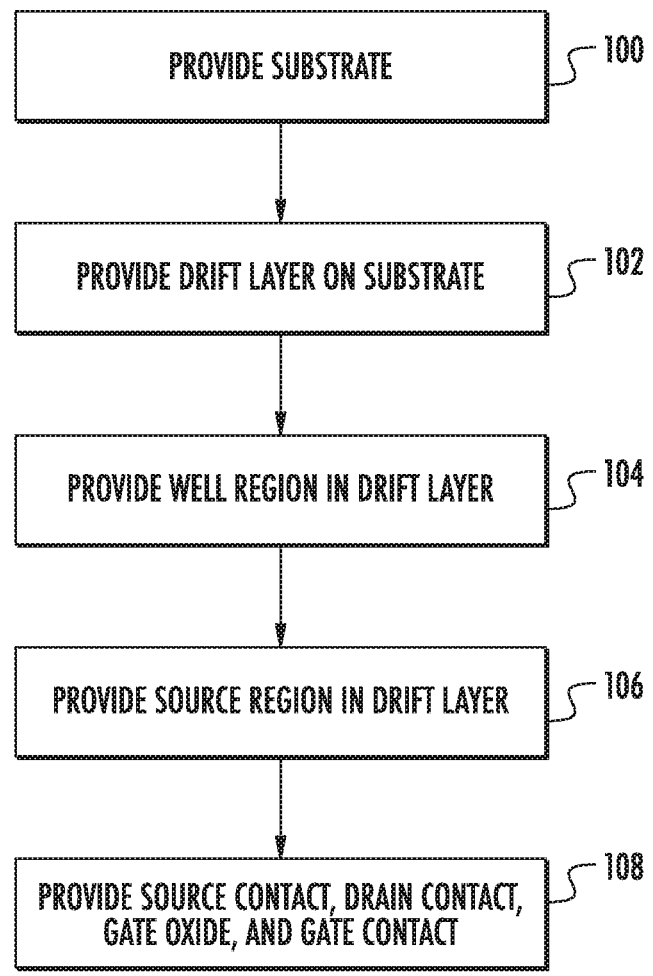
FIG. 5 is a flowchart illustrating a method for manufacturing a semiconductor device according to one embodiment of the present disclosure.
Figure 6A:
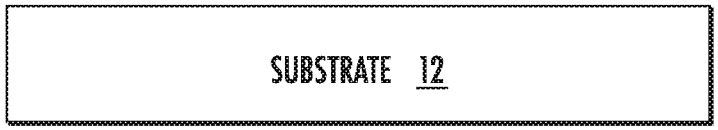
FIGS. 6A through 6E illustrate a method for manufacturing a semiconductor device according to one embodiment of the present disclosure.
Figure 6B:
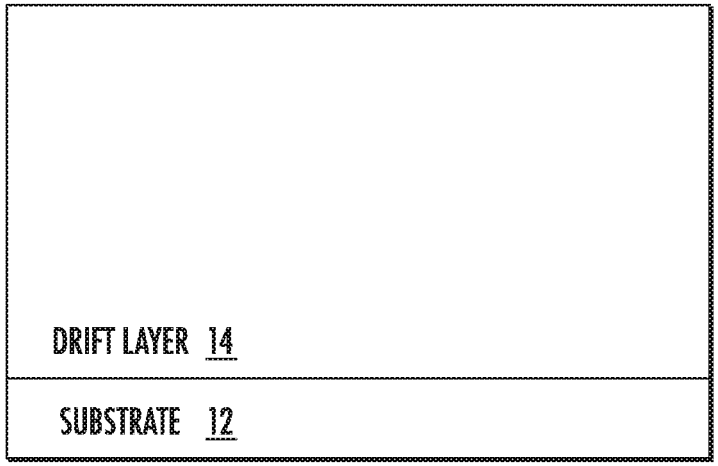
Figure 6C:
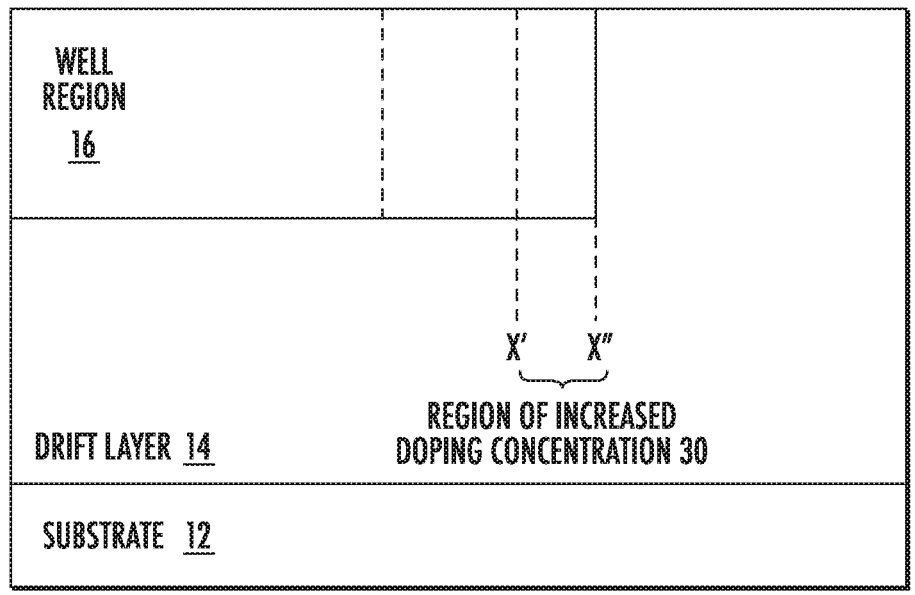
Figure 6D:
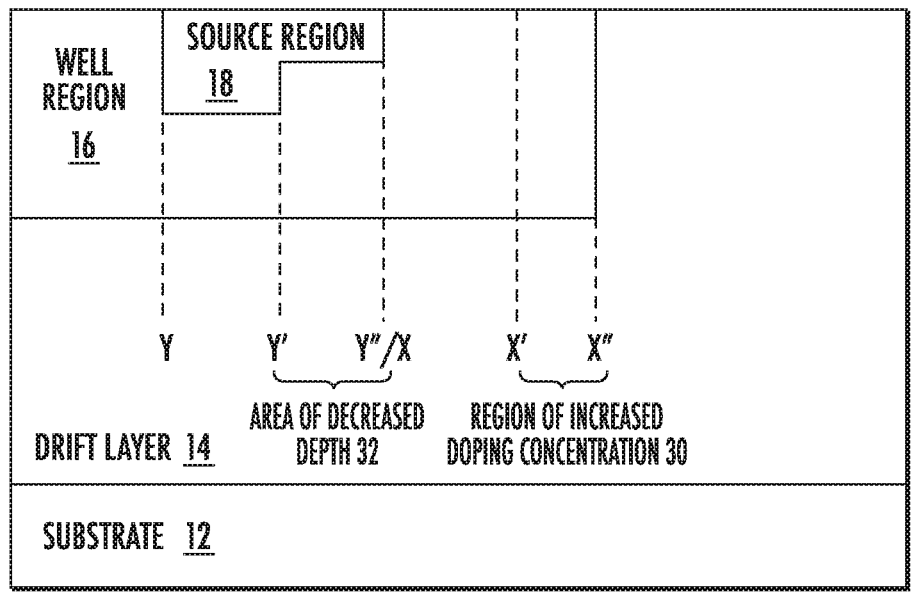
Figure 6E:
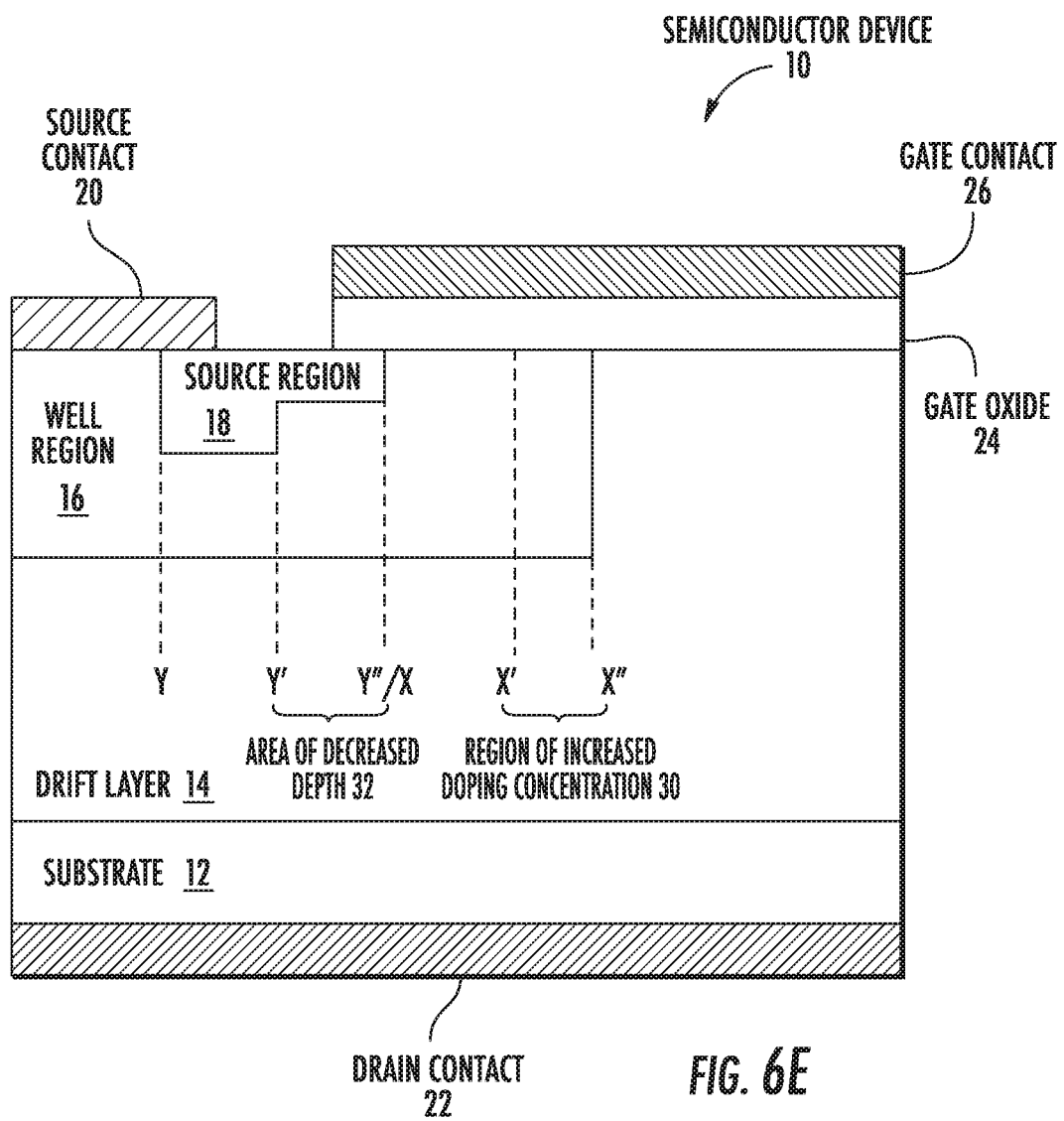

FIG. 5 is a flowchart illustrating a method for manufacturing the semiconductor device 10 according to one embodiment of the present disclosure. FIGS. 6A through 6E illustrate the steps of the flowchart in FIG. 5 and thus are discussed alongside FIG. 5. First, the substrate 12 is provided (block 100 and FIG. 6A). The substrate 12 may comprise silicon carbide, and in particular may comprise a silicon carbide semiconductor wafer. The drift layer 14 is provided on the substrate 12 (block 102 and FIG. 6B). The drift layer 14 may be provided by any suitable process, for example, an epitaxy process wherein the drift layer 14 is grown on the substrate 12 and subsequently processed (e.g., cleaned, polished, etc.) The well region 16 is provided in the surface of the drift layer 14 opposite the substrate 12 (block 104 and FIG. 6C). As discussed in further detail below, the well region 16 may be provided via an implantation process such as ion implantation. A specialized mask may be provided on the surface of the drift layer 14 opposite the substrate 12 during said implantation process to form a desired doping profile in the well region 16 such that the region of increased doping concentration 30 is provided to increase the short circuit withstand time of the semiconductor device 10 as discussed above. The source region 18 is provided in the surface of the drift layer 14 opposite the substrate 12 (block 106 and FIG. 6D). As discussed in further detail below, the source region 18 may be provided via an implantation process such as ion implantation. A specialized mask may be provided on the surface of the drift layer 14 opposite the substrate 12 during said implantation process to form a desired depth profile of the source region 18 such that the area of decreased depth 32 is provided to increase the short circuit withstand time of the semiconductor device 10 as discussed above. The source contact 20, drain contact 22, gate oxide 24, and gate contact 26 are provided (block 108 and FIG. 6E).

Figure 7:
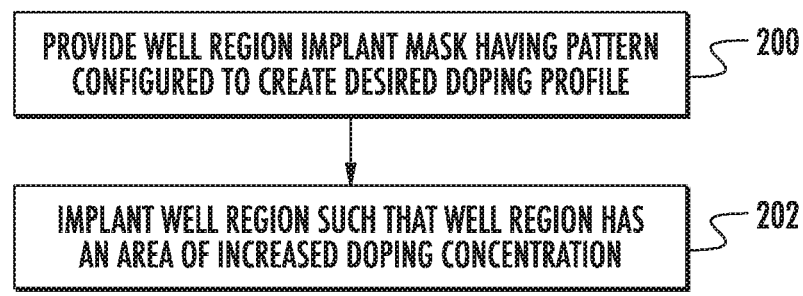
FIG. 7 is a flowchart illustrating a method for providing a well region in a semiconductor device according to one embodiment of the present disclosure.
Figure 8A:
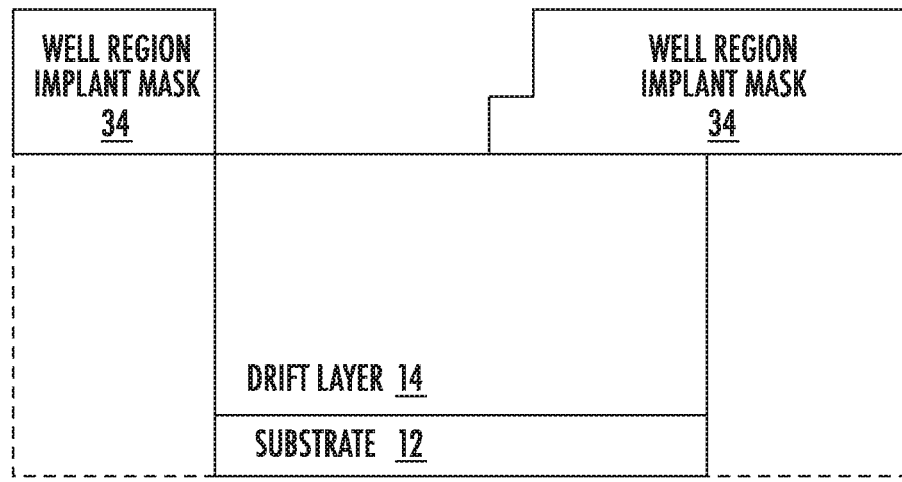
FIGS. 8A and 8B illustrate a method for providing a well region in a semiconductor device according to one embodiment of the present disclosure.
Figure 8B:
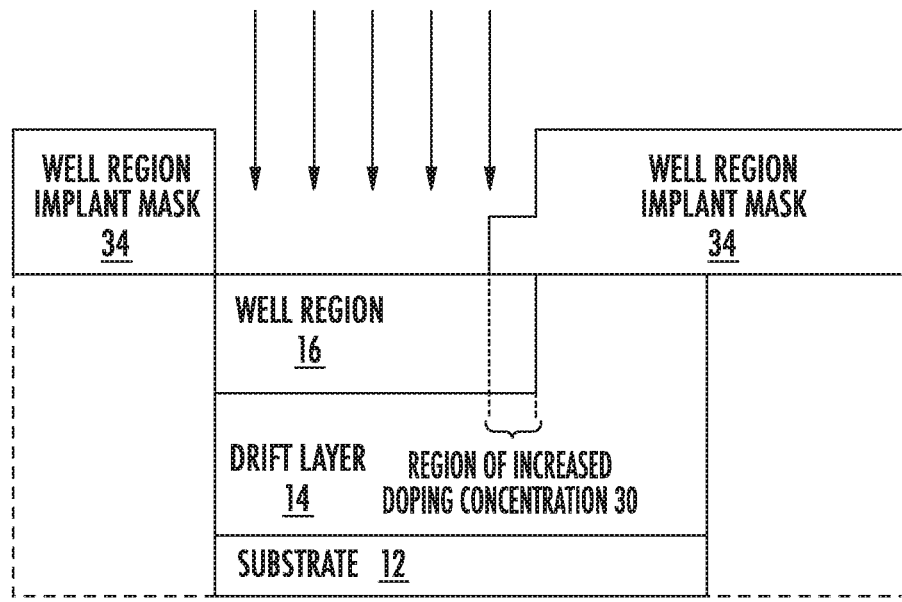
Figure 9A:
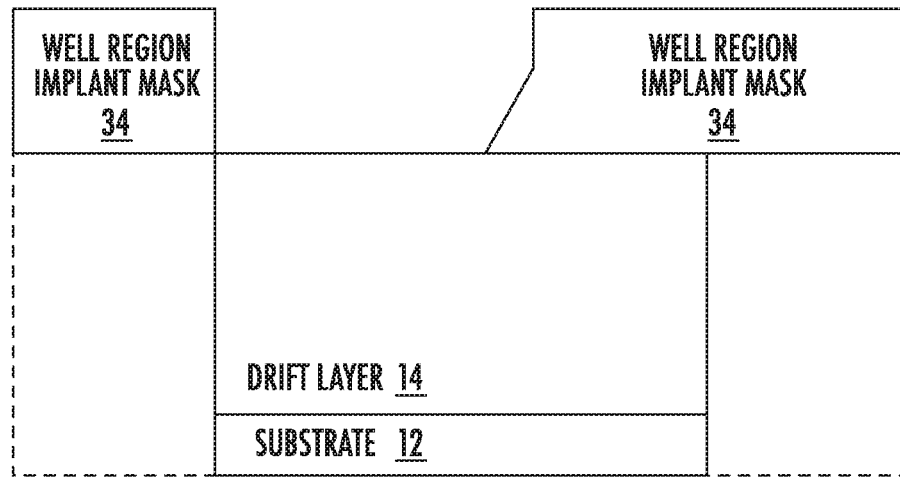
FIGS. 9A and 9B illustrate a method for providing a well region in a semiconductor device according to one embodiment of the present disclosure.
Figure 9B:
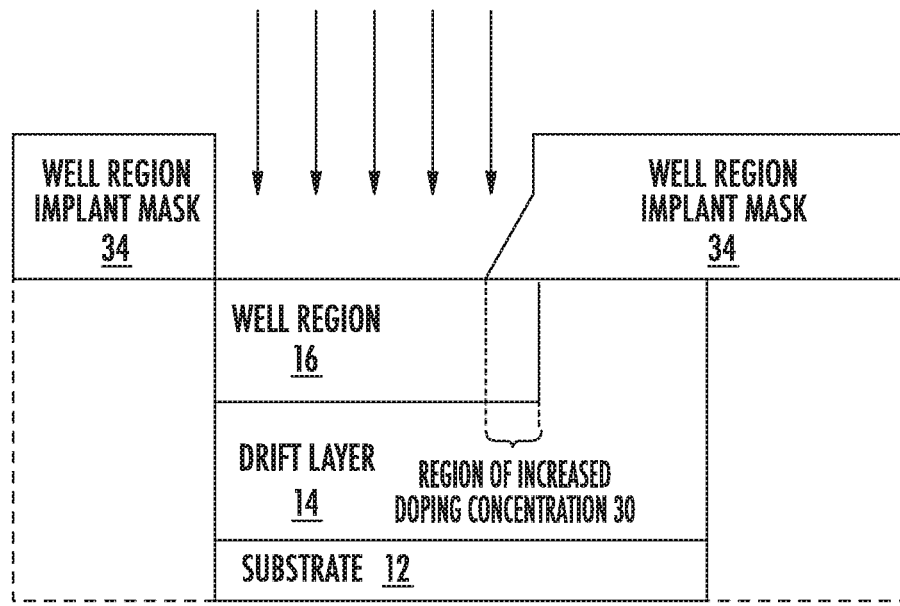

FIG. 7 is a flowchart illustrating details of providing the well region 16 according to one embodiment of the present disclosure. FIGS. 8A through 8B as well as 9A through 9B illustrate the steps of the flowchart in FIG. 7 and thus are discussed alongside FIG. 7. First, a well region implant mask 34 is provided on the surface of the drift layer 14 opposite the substrate 12 (block 200, FIG. 8A and FIG. 9A). Notably, the well region implant mask 34 is a specialized mask that is configured to create a desired doping profile in the well region 16. In particular, a thickness of the well region implant mask 34, a density of the well region implant mask 34, and/or a material of the well region implant mask 34 may be varied to create a desired doping profile of the well region 16. Varying the characteristics of the well region implant mask 34 along with choosing a doping depth profile for implanting ions into the drift layer 14 to create the well region 16 changes a doping concentration of the well region 16 at the surface of the drift layer 14 opposite the substrate 12 because it changes how deep the ions are implanted therein. In FIG. 8A, a simple step down in the thickness of the well region implant mask 34 is shown over the area in which the region of increased doping concentration 30 will be formed after ion implantation. The step down in the thickness of the well region implant mask 34 over the region of increased doping concentration 30 causes the ions not to penetrate as deeply into the region of increased doping concentration 30, resulting in a heavier doping concentration near the surface of the drift layer 14 opposite the substrate 12 in this area. In FIG. 9A, a ramp in the thickness of the well region implant mask 34 is provided over the area in which the region of increased doping concentration 30 will be formed after ion implantation. The ramp in the thickness of the well region implant mask 34 over the region of increased doping concentration 30 causes the ions to penetrate to different depths over the ramp in this area, resulting in a ramped increase in doping concentration in the region of increased doping concentration 30. Notably, the well region implant mask 34 shown in FIGS. 8A and 9A is merely exemplary. Any suitable processes for obtaining the region of increased doping concentration 30 may be used to create the well region 16, all of which are contemplated herein. Ions are then implanted into the surface of the drift layer 14 opposite the substrate 12 and through the well region implant mask 34 (block 202, FIGS. 8B and 9B). As discussed above, this creates the well region 16 and the region of increased doping concentration 30. The well region implant mask 34 may then be removed (not shown). In one embodiment, the ions may be implanted using a retrograde doping profile such that a peak doping concentration due to implantation occurs at some distance below a surface of implantation. Controlling the retrograde doping profile of ion implantation along with the characteristics (e.g., thickness) of the well region implant mask 34 allows for creation of a desired doping profile of the well region 16 along the surface of the drift layer 14 opposite the substrate 12 as discussed above. To achieve the desired doping profile of the well region 16, an implantation dose between $1 \times 10^{12}$ and $5 \times 10^{15}$ cm$^{-2}$ may be used along with an implantation energy between 10 keV and 1.5 MeV. The dopant used to form the well region may be aluminum, boron, or beryllium in various embodiments.

Figure 10:
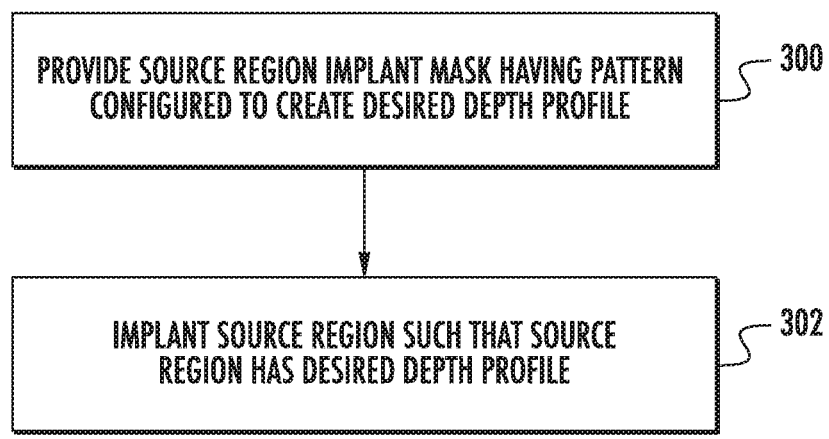
FIG. 10 is a flowchart illustrating a method for providing a source region in a semiconductor device according to one embodiment of the present disclosure.
Figure 11A:
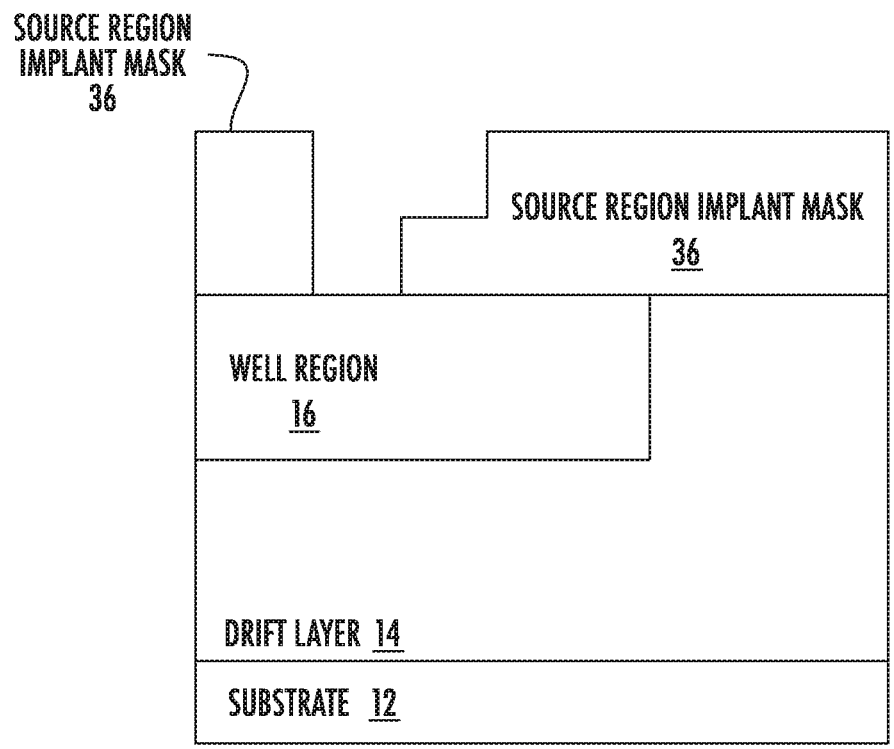
FIGS. 11A and 11B illustrate a method for providing a source region in a semiconductor device according to one embodiment of the present disclosure.
Figure 11B:
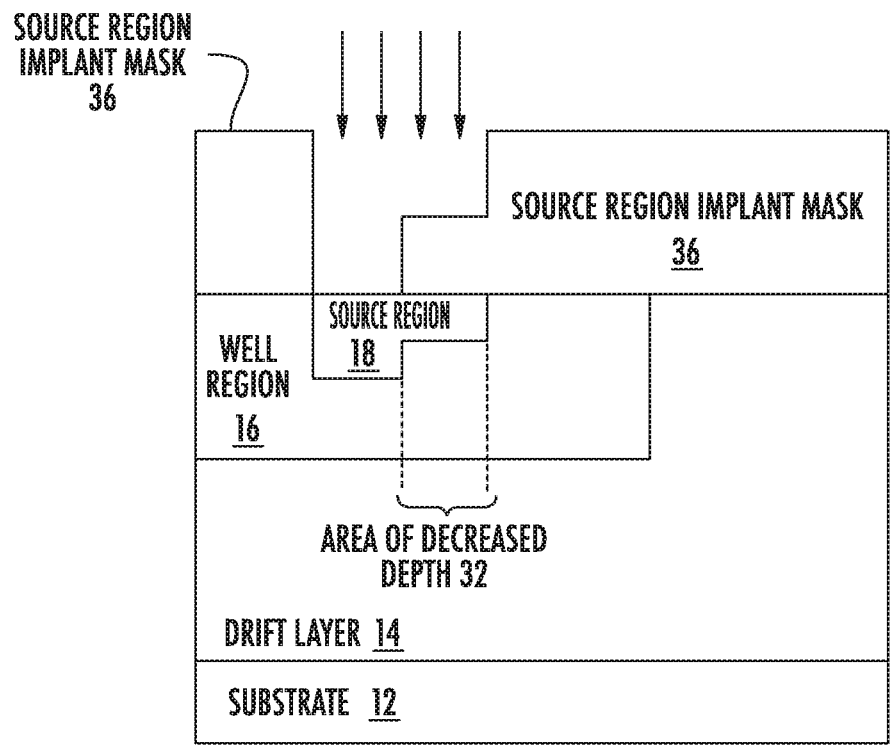
Figure 12A:
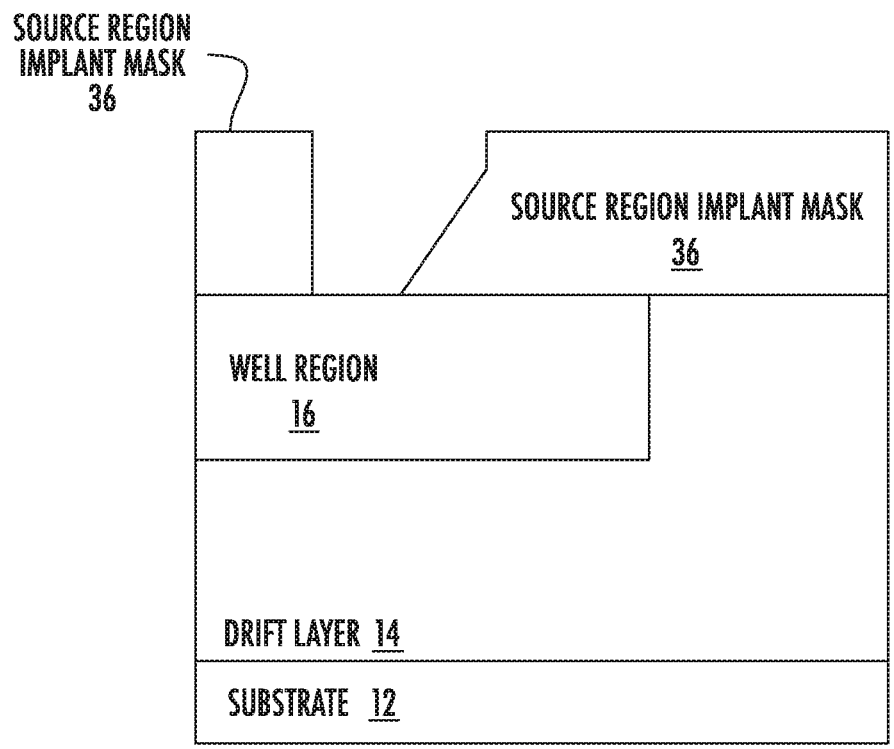
FIGS. 12A and 12B illustrate a method for providing a source region in a semiconductor device according to one embodiment of the present disclosure.
Figure 12B:
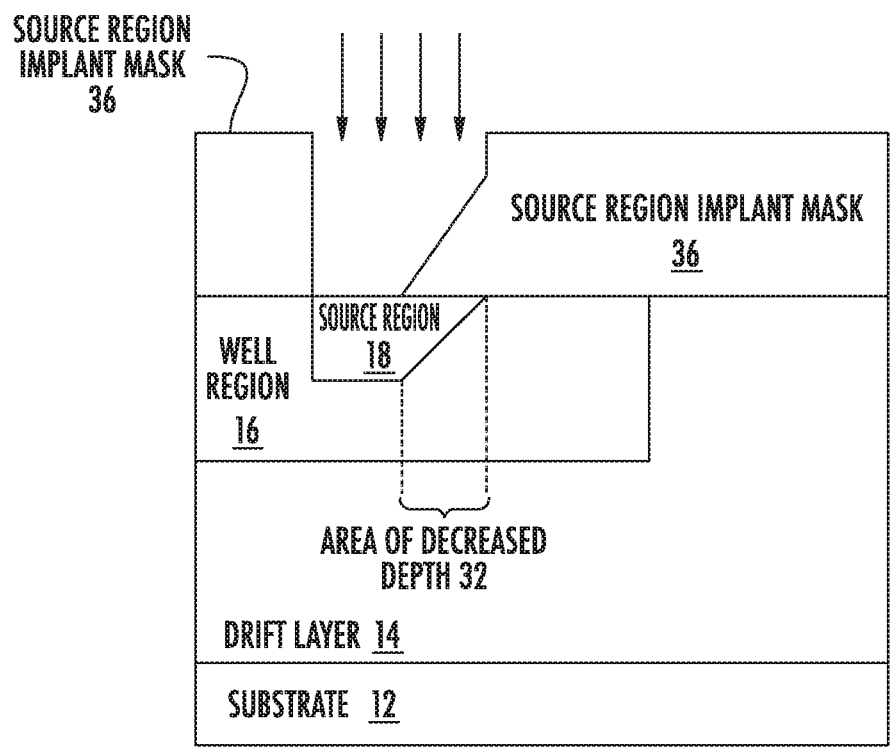

FIG. 10 is a flowchart illustrating a method for manufacturing the semiconductor device 10 according to one embodiment of the present disclosure. FIGS. 11A through 11B and 12A through 12B illustrate the steps of the flowchart in FIG. 10 and thus are discussed alongside FIG. 10. First, a source region implant mask 36 is provided on the surface of the drift layer 14 opposite the substrate 12 (block 300, FIG. 11A and FIG. 12A). Notably, the source region implant mask 36 is a specialized mask that is configured to create a desired depth profile in the source region 18. In particular, a thickness of the source region implant mask 36, a density of the source region implant mask 36, and/or a material of the source region implant mask 36 may be varied to create a desired depth profile of the source region 18. Varying the characteristics of the source region implant mask 36 as well as a doping depth profile for implanting ions into the drift layer 14 to create the source region 18 changes a doping concentration of the source region 18 at the surface of the drift layer 14 opposite the substrate 12 because it changes how deep the ions are implanted therein. In FIG. 11A, a simple step down in the thickness of the source region implant mask 36 over the area of decreased depth 32, which is not shown but will be formed after ion implantation, causes the ions not to penetrate as deeply and thus create the area of decreased depth 32. In FIG. 12A, a ramp in the thickness of the source region implant mask 36 provided over the area of decreased depth 32, which is not shown but will be formed after ion implantation, causes the depth of the source region 18 to decrease as the ramp becomes thicker towards the channel region 28 of the semiconductor device 10. Notably, the source region implant mask 36 shown in FIGS. 11A and 12A is merely exemplary. Any suitable processes for obtaining the area of decreased depth 32 may be used to create the source region 18, all of which are contemplated herein. Ions are then implanted into the surface of the drift layer 14 opposite the substrate 12 and through the source region implant mask 36 (block 302, FIGS. 11B and 12B). As discussed above, this creates the source region 18 and the area of decreased depth 32. The mask may then be removed (not shown). In one embodiment, the ions may be implanted using a flat doping profile such that the doping concentration due to ion implantation is relatively constant up to an ion implantation depth. Controlling the flat doping profile of ion implantation along with the characteristics (e.g., thickness) of the source region implant mask 36 allows for creation of a desired depth profile of the source region 18. To achieve the desired doping profile of the source region 18, an implantation dose between $1 \times 10^{13}$ and $5 \times 10^{15}$ cm$^{-2}$ may be used along with an implantation energy between 10 keV and 1.5 MeV. The dopant used to form the source region 18 may be nitrogen, phosphorous, and arsenic in various embodiments.

While the foregoing examples are discussed in the context of a MOSFET device, the principles of the present disclosure are not so limited. The features discussed above may apply to any type of semiconductor device such as any type of transistor device, any type of diode, etc. Further, those skilled in the art will recognize improvements and modifications to the preferred embodiments of the present disclosure. All such improvements and modifications are considered within the scope of the concepts disclosed herein and the claims that follow.

What is claimed is:
1. A semiconductor device comprising:
   a substrate, the substrate having a first conductivity type;
   a drift layer on the substrate, the drift layer having the first conductivity type;
   a well region in the drift layer, wherein:
      the well region has a second conductivity type opposite the first conductivity type; and
      the well region provides a channel region; and
   a source region in the well region, wherein:
      the well region is between the source region and the drift layer;
      the source region has the first conductivity type; and
      the channel region comprises a first region of increased doping concentration at a surface of the drift layer opposite the substrate, and the first region is laterally separated from the source region along the surface of the drift layer by a second region having a laterally constant doping concentration that is lower than the increased doping concentration of the first region.

2. The semiconductor device of claim 1 wherein a doping concentration of the first region along the surface of the drift layer opposite the substrate increases in proportion to a distance between an interface between the source region and the well region such that the increase in doping concentration is towards an interface between the well region and the drift region along the surface of the drift region opposite the substrate.

3. The semiconductor device of claim 1 wherein the first region is located along an interface between the well region and the drift region.

4. The semiconductor device of claim 3 wherein a doping concentration of the first region is between 1.1 and 250 times greater than a doping concentration of the remainder of the well region.

5. The semiconductor device of claim 4 wherein the doping concentration of the first region is between $2\times10^{17}$ and $5\times10^{19}$ cm$^{-3}$.

6. The semiconductor device of claim 5 wherein a doping concentration of the second region is between $5\times10^{15}$ and $5\times10^{17}$ cm$^3$.

7. The semiconductor device of claim 3 wherein a distance between the first region and an interface between the source region and the well region is between 0.2 and 2 μm.

8. The semiconductor device of claim 3 wherein a doping concentration of the first region along the surface of the drift layer opposite the substrate varies in a linear fashion.

9. The semiconductor device of claim 3 wherein a doping concentration of the first region along the surface of the drift layer opposite the substrate varies in a stepwise fashion.

10. The semiconductor device of claim 3 wherein a doping concentration of the first region along the surface of the drift layer opposite the substrate varies in an exponential fashion.

11. The semiconductor device of claim 1 wherein the semiconductor device is a metal-oxide-semiconductor field-effect transistor (MOSFET).

12. The semiconductor device of claim 11 further comprising:
   a drain contact on a surface of the substrate opposite the drift layer;
   a source contact on the surface of the drift layer opposite the substrate such that the source contact is in contact with the source region and the well region;
   a gate oxide on the surface of the drift layer opposite the substrate such that the gate oxide is in contact with the well region and the source region and separated from the source contact, wherein the channel region of the MOSFET is below the gate oxide in the well region; and
   a gate contact on the gate oxide.

13. The semiconductor device of claim 1 wherein a depth of the source region is non-uniform.

14. The semiconductor device of claim 13 wherein the depth of the source region increases in proportion to a distance from the channel region.

15. A semiconductor device comprising:
   a substrate, the substrate having a first conductivity type;
   a drift layer on the substrate, the drift layer having the first conductivity type;
   a well region in the drift layer, wherein:
      the well region has a second conductivity type opposite the first conductivity type; and
      the well region provides a channel region; and
   a source region in the well region, wherein:
      the well region is between the source region and the drift layer;
      the source region has the first conductivity type;
      the source region comprises a first region of decreased depth compared to a second region of the source region; and
      a doping concentration of the source region remains constant across the first region and the second region.

16. The semiconductor device of claim 15 wherein a depth of the source region increases in proportion to a distance from the channel region.

17. The semiconductor device of claim 16 wherein the depth of the source region at a first edge of the source region nearest the channel region is between 0.06 and 0.93 times less than the depth of the source region at a second edge of the source region opposite the first edge.

18. The semiconductor device of claim 16 wherein the depth of the source region varies in a linear fashion.

19. The semiconductor device of claim 16 wherein the depth of the source region varies in a stepwise fashion.

20. The semiconductor device of claim 15, wherein the channel region comprises a first region of increased doping concentration at a surface of the drift layer opposite the substrate, and the first region is laterally separated from the source region along the surface of the drift layer by a second region having a laterally constant doping concentration.

21. A method for manufacturing a semiconductor device comprising:
   providing a substrate having a first conductivity type;
   providing a drift layer on the substrate, the drift layer having the first conductivity type;
   providing a well region in the drift layer such that:
      the well region has a second conductivity type opposite the first conductivity type; and
      the well region provides a channel region; and
   providing a source region in the well region such that:
      the well region is between the source region and the drift layer;
      the source region has the first conductivity type; and
      the channel region comprises a first region of increased doping concentration at a distance from a junction between the source region and the well region, and the first region is laterally separated from the source region along a lateral surface of the drift layer opposite the substrate by a second region having a laterally constant doping concentration that is lower than the increased doping concentration of the first region.

22. The method of claim 21 wherein the well region is provided such that a doping concentration of the first region is between 1.1 and 250 times greater than a doping concentration of the second region.

23. The method of claim 21 wherein a doping concentration of the first region is between $2\times10^{17}$ and $5\times10^{19}$ cm$^{-3}$.

24. The method of claim 23 wherein a doping concentration of the second region is between $5\times10^{15}$ and $5\times10^{17}$ cm$^{-3}$.

25. The method of claim 21 wherein the distance between the first region of increased doping concentration and the junction between the source region and the well region is between 0.2 and 2 μm.

26. The method of claim 21 wherein:
   providing the well region comprises providing a well implantation mask on the drift layer and performing an ion implantation process; and
   providing the source region comprises providing a source implantation mask on the drift layer and performing an ion implantation process.

27. The method of claim 26 wherein providing the drift layer comprises growing the drift layer via an epitaxy process.

* * * * *

UNITED STATES PATENT AND TRADEMARK OFFICE
CERTIFICATE OF CORRECTION

| | | |
|---|---|---|
| PATENT NO. | : 11,309,413 B2 | Page 1 of 1 |
| APPLICATION NO. | : 16/598646 | |
| DATED | : April 19, 2022 | |
| INVENTOR(S) | : Ryu | |

It is certified that error appears in the above-identified patent and that said Letters Patent is hereby corrected as shown below:

In the Specification

Column 5, Lines 6-7, replace "in the range between $2\times10^{17}$ and $5\times10^{18}$ cm$^{-3}$" with --in the range between $2\times10^{17}$ and $5\times10^{19}$ cm$^{-3}$--.

Column 5, Lines 9-13, replace "may be between $5\times10^{17}$ and $5\times10^{18}$ cm$^{-3}$, between $1\times10^{18}$ and $5\times10^{18}$ cm$^{-3}$, between $5\times10^{18}$ and $5\times10^{18}$ cm$^{-3}$, between $1\times10^{18}$ and $5\times10^{18}$ cm$^{-3}$, between $5\times10^{17}$ and $1\times10^{18}$ cm$^{-3}$, between $1\times10^{18}$ and $1\times10^{18}$ cm$^{-3}$" with --may be between $5\times10^{17}$ and $5\times10^{19}$ cm$^{-3}$, between $1\times10^{18}$ and $5\times10^{19}$ cm$^{-3}$, between $5\times10^{18}$ and $5\times10^{19}$ cm$^{-3}$, between $1\times10^{19}$ and $5\times10^{19}$ cm$^{-3}$, between $5\times10^{17}$ and $1\times10^{18}$ cm$^{-3}$, between $1\times10^{18}$ and $1\times10^{19}$ cm$^{-3}$--.

Column 5, Line 14, replace "a doping concentration between $5\times10^{18}$" with --a doping concentration between $5\times10^{15}$--.

Column 5, Line 17, replace "range between $5\times10^{18}$ and $5\times10^{17}$ cm$^{-3}$" with --range between $5\times10^{15}$ and $5\times10^{17}$ cm$^{-3}$--.

Column 5, Lines 20-22, replace "between $1\times10^{18}$ and $5\times10^{17}$ cm$^{-3}$, between $5\times10^{18}$ and $5\times10^{17}$ cm$^{-3}$, between $1\times10^{17}$ and $5\times10^{17}$ cm$^{-3}$, between $5\times10^{18}$ and $1\times10^{17}$ cm$^{-3}$, between $5\times10^{18}$ and $5\times10^{16}$ cm$^{-3}$" with --between $1\times10^{16}$ and $5\times10^{17}$ cm$^{-3}$, between $5\times10^{16}$ and $5\times10^{17}$ cm$^{-3}$, between $1\times10^{17}$ and $5\times10^{17}$ cm$^{-3}$, between $5\times10^{15}$ and $1\times10^{17}$ cm$^{-3}$, between $5\times10^{15}$ and $5\times10^{16}$ cm$^{-3}$--.

Column 5, Lines 30-31, replace "between $1\times10^{29}$ and $5\times10^{21}$ cm$^{-3}$, between $5\times10^{29}$ and $5\times10^{21}$ cm$^{-3}$" with --between $1\times10^{20}$ and $5\times10^{21}$ cm$^{-3}$, between $5\times10^{20}$ and $5\times10^{21}$ cm$^{-3}$--.

Column 5, Line 33, replace "between $1\times10^{18}$ and $5\times10^{29}$ cm$^{-3}$" with --between $1\times10^{18}$ and $5\times10^{20}$ cm$^{-3}$--.

Signed and Sealed this
Eleventh Day of October, 2022

Katherine Kelly Vidal
*Director of the United States Patent and Trademark Office*